United States Patent
Nagaraj et al.

(10) Patent No.: US 11,387,837 B1
(45) Date of Patent: Jul. 12, 2022

(54) SUCCESSIVE APPROXIMATION REGISTER ANALOG TO DIGITAL CONVERTER

(71) Applicant: Texas Instruments Incorporated, Dallas, TX (US)

(72) Inventors: Krishnaswamy Nagaraj, Plano, TX (US); Joonsung Park, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/137,691

(22) Filed: Dec. 30, 2020

(51) Int. Cl.
  *H03M 1/00* (2006.01)
  *H03M 1/46* (2006.01)

(52) U.S. Cl.
  CPC ..................... *H03M 1/46* (2013.01)

(58) Field of Classification Search
  CPC ........ H03M 1/462; H03M 1/46; H03M 1/466; H03M 1/468; H03M 1/38; H03M 1/002; H03M 1/1009; H03M 1/363; H03M 1/12; H03M 1/124; H03M 3/458; H03M 1/06; H03M 1/08; H03M 1/442; H03M 1/069; H03M 1/1023; H03M 1/804; H03M 1/0626; H03M 1/0863
  USPC .......................... 341/118, 120, 161, 172, 122
  See application file for complete search history.

(56) References Cited

U.S. PATENT DOCUMENTS

| | | | |
|---|---|---|---|
| 9,252,800 B1* | 2/2016 | Park .................. | H03M 1/20 |
| 10,177,779 B2 | 1/2019 | Lee et al. | |
| 10,469,095 B2 | 11/2019 | Lin et al. | |
| 2011/0001492 A1* | 1/2011 | Nys .................... | H03M 1/123 |
| | | | 324/658 |
| 2011/0234433 A1* | 9/2011 | Aruga ................ | H03M 1/06 |
| | | | 341/172 |
| 2012/0326901 A1* | 12/2012 | Zhao ................. | H03M 1/0604 |
| | | | 341/172 |
| 2013/0321053 A1* | 12/2013 | Bogner ............. | H03M 1/128 |
| | | | 327/299 |
| 2014/0070976 A1* | 3/2014 | Hurrell .............. | H03M 1/1245 |
| | | | 341/172 |
| 2014/0184435 A1 | 7/2014 | Wang et al. | |
| 2015/0091746 A1 | 4/2015 | Wang | |
| 2017/0012633 A1* | 1/2017 | Venca ............... | H03M 3/322 |
| 2018/0183454 A1* | 6/2018 | Lee .................... | H03M 1/145 |
| 2018/0309450 A1* | 10/2018 | Yagishita .......... | H03K 19/0185 |

OTHER PUBLICATIONS

International Search Report for PCT/US2021/065612 dated Apr. 7, 2022.

* cited by examiner

*Primary Examiner* — Linh V Nguyen
(74) *Attorney, Agent, or Firm* — Brian D. Graham; Charles A. Brill; Frank D. Cimino

(57) ABSTRACT

A successive approximation analog-to-digital with an input for receiving an input analog voltage, and an amplifier with a first set of electrical attributes in a sample phase and a second set of electrical attributes, differing from the first set of electrical attributes, in a conversion phase.

20 Claims, 3 Drawing Sheets

SUCCESSIVE APPROXIMATION REGISTER ANALOG TO DIGITAL CONVERTER

CROSS-REFERENCE TO RELATED APPLICATION

Not applicable.

BACKGROUND

The example embodiments relate to analog-to-digital converters (ADC singular, ADCs plural) and, more particularly, to successive approximation register (SAR) ADCs.

A SAR ADC converts an analog input voltage signal to a digital output value, sometimes referred to as a code, by successively comparing the input to an internally-generated and changing reference voltage. For each successive comparison, the reference voltage is adjusted to converge toward the value of the analog input voltage signal, while each such adjustment and comparison determines a respective bit of the SAR ADC output code. Further, as the differential between the input and reference voltage thus converges, the reference voltage change is smaller in each successive comparison, and the smaller reference voltage and differential is therefore more susceptible to error.

A SAR ADC is typically embodied as, or part of, an integrated circuit (IC). Accordingly, typical IC design considerations are factors for the SAR ADC, such as area and power consumed by the device. Further, as SAR ADCs have advanced, for example operating at higher speed and with a greater number of output bits, additional design considerations are directed to output accuracy. For example, noise impacts the SAR ADC input signal, its components that process the input signal, and the proper assessment of the converging differential between the input signal and reference voltage. Accordingly, noise effects may be considered to the extent those can cause a signal state change greater than the least significant bit (LSB) resolution of the device, that is, potentially producing an error in the output or limiting the resolution of the output code.

While the preceding considerations are generally common to most SAR ADCs, different designers may prioritize different design considerations, for example considering different sources of noise and designs to mitigate nose effects. Accordingly, example embodiments are provided in this document that may improve on various of such noise considerations as well as other concepts, as further described below.

SUMMARY

A successive approximation analog-to-digital converter an input for receiving an input analog voltage. The converter further comprises sample phase circuitry comprising an amplifier and for providing the amplifier with a first set of electrical attributes and for sampling the input analog voltage in a sample phase, and conversion phase circuitry comprising the amplifier and for providing the amplifier with a second set of electrical attributes differing from the first set of electrical attributes and for converting a comparison, of the sampling of the input analog voltage relative to a reference voltage, to a digital value in a conversion phase.

Other aspects are also disclosed and claimed.

DETAILED DESCRIPTION

Figure 1:
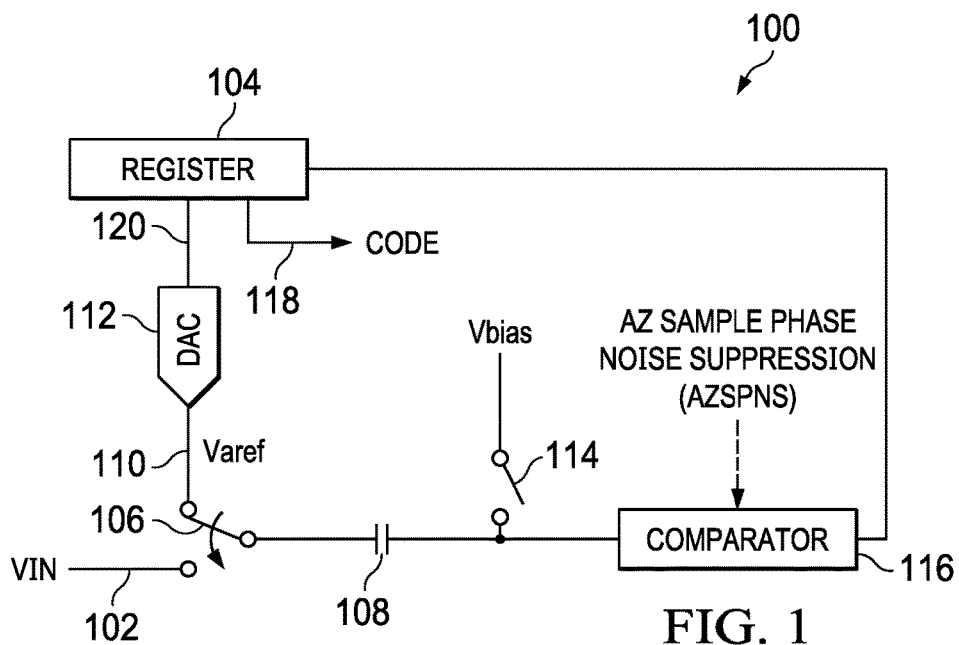
FIG. 1 illustrates a schematic of an example embodiment SAR ADC.

FIG. 1 illustrates a schematic of an example embodiment SAR ADC 100. SAR ADC receives an analog input voltage VIN at an input node 102 and ultimately produces, in an N-bit register 104, a CODE corresponding to the magnitude of VIN. Particularly, VIN is connected to the input node 102, which is a first of two switch throws of an input switch 106. The input switch 106 has a pole connected to a first plate of a sample capacitor 108, and the input switch 106 has a second throw connected to an output node 110 of a digital-to-analog converter (DAC) 112. A second plate of the sampling capacitor 108 is connected to a throw of a first bias switch 114, and the throw of the first bias switch 114 is connected to receive a bias voltage Vbias through the first bias switch 114. The throw of the first bias switch 114 also is connected as an input to a comparator 116. The output of the comparator 116 is connected to the register 104. A first output 118 of the register 104 provides the CODE output once the SAR ADC 100 completes its conversion of VIN, and a second output 120 of the register 104 provides the CODE output, as it is being determined in its entirety, to the input of the DAC 112. It is noted that the capacitance of the sampling capacitor 108 may be implemented as part of the same capacitor, or capacitive element(s), as the DAC 112, although for sake of simplification in this document those are shown as separate structures. It is further noted that the illustrated switches (including the input switch 106 and the first bias switch 114) are functional representations that may be implemented using a variety of circuit elements, such as transistors.

The general operation of the SAR ADC 100 is as follows, with additional structural and operational details provided later. The SAR ADC 100 in a first phase samples VIN and then in a second phase performs conversion by iteratively comparing the sampled VIN to different internally-generated reference voltages, provided from the DAC 112. Transitions between the sample phase and iterative conversion phase are executed in part by the input switch 106 and the first bias switch 114, as described later. Further, the overall SAR ADC 100 operation is improved by implementing into the sample phase an auto zeroing (AZ) sample phase noise suppression (AZSPNS) aspect, shown generally in FIG. 1 as a control input to the comparator 116 and also described later. Together, the sample phase and one or more iterative conversion phases determine a successive bit stored in the N-bit register 104, where completion of all iterations completes the total number of N bits in the register 104 as the CODE at the output 118. For example, VIN is sampled in a sample phase and then in a first iteration of the conversion phase, the sample VIN is compared, by the comparator 116, to an analog reference voltage Varef, where Varef is output by the DAC 112 in response to a CODE then in the register 104. For instance, in the first iteration of the conversion phase, the most significant bit (MSB) of the N-bit value in the register 104 is set high, while all lesser significant bits in the register 104 are low. So, in this conversion phase first iteration, the SAR ADC 100 compares VIN to the voltage Varef which corresponds to the MSB-high value in the N-bit register 104. If VIN is greater in that comparison, then the MSB is left (or overwritten) high and the next lesser significant bit is set for the next conversion phase iteration. If VIN is lesser in that comparison, then the MSB is zeroed and the next lesser significant bit is set for the next conversion phase iteration. The above process repeats for each successive iteration, until all N bits in the N-bit register 104 have been set to establish a corresponding Varef that is compared to VIN as has been described. Upon completion of all iterations, the N-bit value in the N-bit register 104 is output as the CODE and is representative of the magnitude of VIN.

Figure 2:
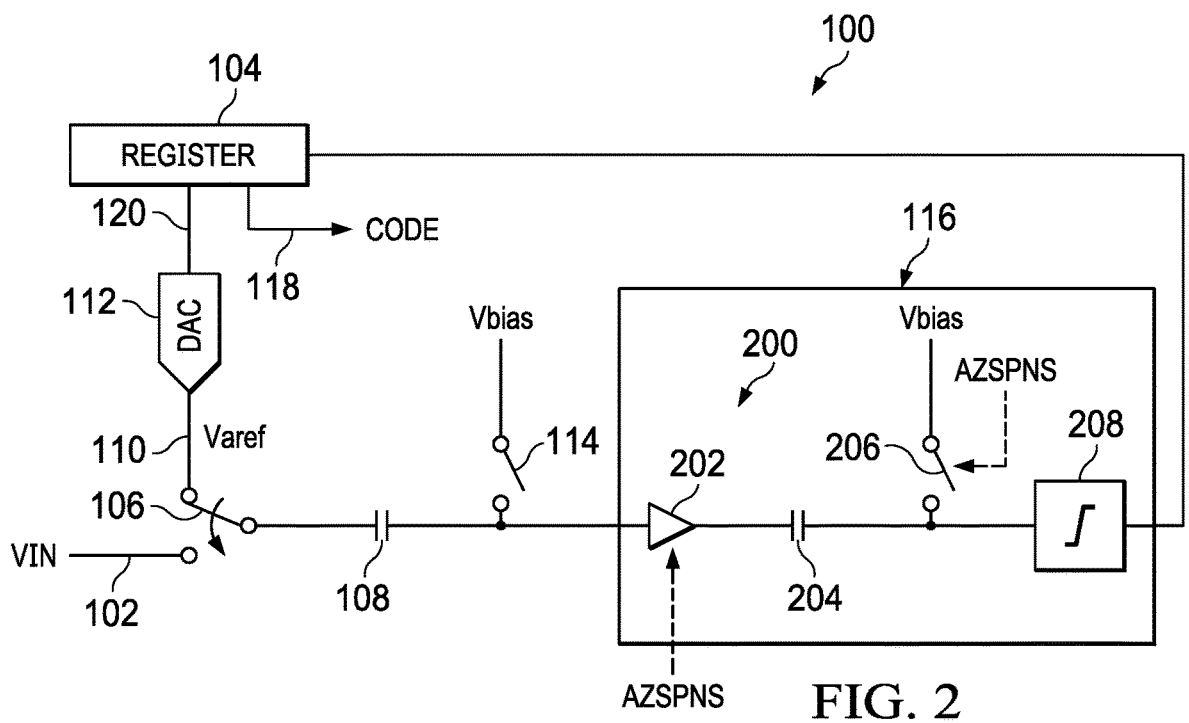
FIG. 2 illustrates a schematic of the FIG. 1 SAR ADC with additional details shown for the FIG. 1 comparator.

FIG. 2 illustrates a schematic of the SAR ADC 100, with additional details shown for the comparator 116. The comparator 116 includes an amplification stage 200, which by way of example is shown to include a single amplifier 202. The amplifier 202 is shown to receive AZSPNS, as the electrical attributes of the amplifier 202 are selectively adjusted as described later, for example to be different during the sample phase as compared to the conversion phase, where the adjustment further improves the AZ performance of the SAR ADC 100. An input of the amplifier 202 is connected to the throw of the first bias switch 114, and an output of the amplifier 202 is connected to a first plate of an AZ capacitor 204. The second plate of the AZ capacitor 204 is connected to a throw of an AZ switch 206. The AZ switch 206 pivots in the direction shown, by an AZSPNS arrow, during sample phase auto zeroing. The pole of the AZ switch 206 is connected to Vbias. The throw of the AZ switch 206 also is connected as an input to a latch 208. An output of the latch 208 is the output of the comparator 116 and, as introduced earlier, is connected to the N-bit register 104. The latch 208 may operate as a threshold detector, so that if its input is below a threshold, then the latch output is a logic low, or if its input is above that threshold then the latch output is a logic high. Alternatively, the amplifier 202 may consist of multiple capacitively coupled stages connected in cascade, with each stage having an AZ switch at its input. The coupling capacitor of the last of these cascaded stages is connected to the input of the latch 208.

Figure 3:
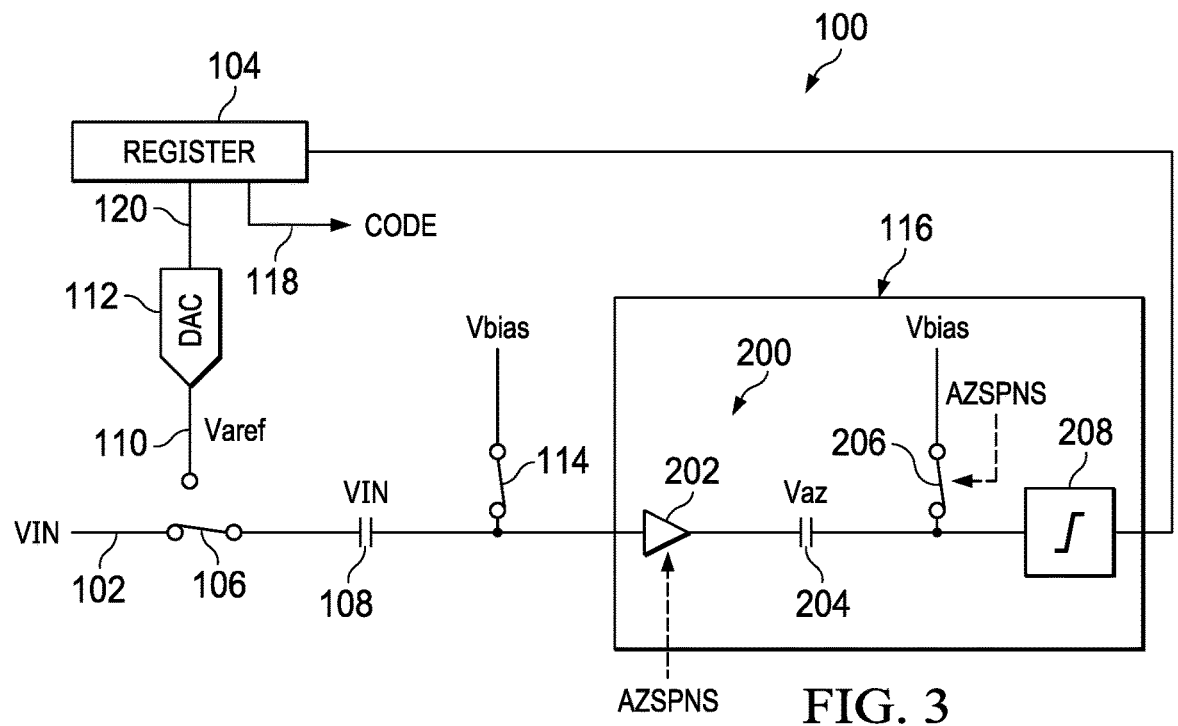
FIG. 3 illustrates the FIG. 2 schematic of the SAR ADC 100, with its three switches positioned to operate in the sample phase.

FIG. 3 illustrates the FIG. 2 schematic of the SAR ADC 100, with its three switches positioned to operate in the sample phase. In the sample phase, two different voltages are sampled and stored on respective capacitors. Specifically, the input switch 106 connects VIN to the first plate of the sampling capacitor 108, while the first bias switch 114 connects Vbias both to amplifier 202 (or multiplier amplifiers, if applicable) and to the second plate of the sampling capacitor 108, thereby providing a low impedance to that capacitor plate. Thus, Vbias serves the dual purpose of biasing the amplifier 202 and providing a low impedance to the capacitor 108. Accordingly, VIN is sampled to the sampling capacitor 108. AZSPNS is also asserted during the sample phase, to position (close) the AZ switch 206 and to control the amplifier 202, the latter selectively adjusting electrical attributes during the sample phase to further improve noise immunity, as described later. Particularly, during the sample phase, the AZSPNS-controlled amplifier 202 outputs an AZ voltage Vaz to the first plate of the of the AZ capacitor 204 that, with the AZ switch 206 closed and thereby connecting the low impedance of Vbias to the second plate of that capacitor, then Vaz is sampled to that AZ capacitor 204. The closed AZ switch 206 also connects Vbias to the input of the latch 208, to bias the input of the latch 208 for correct operation during the conversion phase. By virtue of the fact that the input of the amplifier 202 is connected to a constant voltage Vbias during the sampling phase, Vaz represents the offset plus noise of the amplifier 202.

Figure 4:
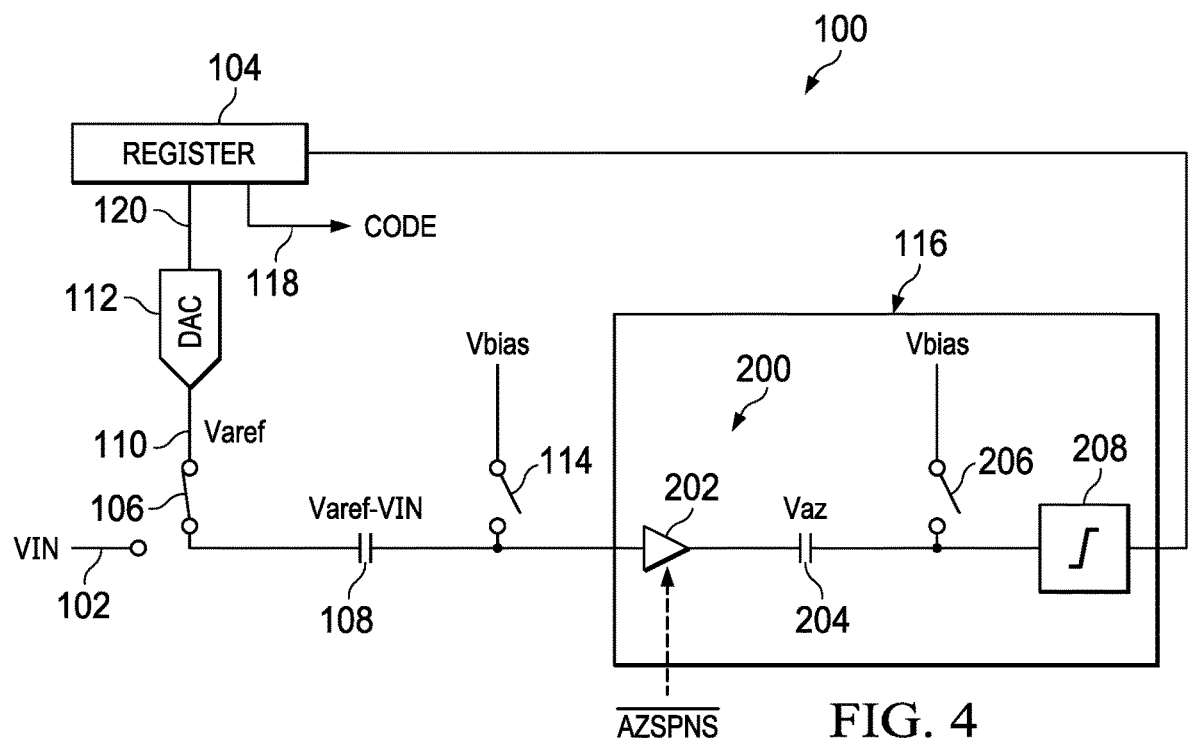
FIG. 4 illustrates the FIG. 2 schematic of the SAR ADC 100, with its three switches positioned to operate in the conversion phase.

FIG. 4 illustrates the FIG. 2 schematic of the SAR ADC 100, with its three switches positioned opposite to that in FIG. 3, so that in FIG. 4 the SAR ADC 100 operates iteratively in the conversion phase. In the conversion phase, the input switch 106 connects the DAC 112 analog reference voltage Varef to the sampled voltage VIN already on the sampling capacitor 108 from the immediately-preceding sample phase. Accordingly, the difference of those two voltages, Varef-VIN, is input to the comparator 116 and thereby to its amplifier 202. Recalling from the above that in the first conversion phase iteration Varef is approximately one-half the voltage capacity of the DAC 112, then the difference provided by Varef-VIN is essentially a comparison of those two voltages, whereby if the difference is positive then Varef is larger than VIN, and if the difference is negative then VIN is larger than Varef. At the same time, AZSPNS is de-asserted, thereby selectively adjusting conversion phase electrical attributes of the amplifier 202 to differ from those of the sample phase. Accordingly, the amplifier 202 operates under the conversion phase electrical attributes to output a voltage G(VIN-Vref), where G is the gain of the amplifier 202 and (VIN-Vref) is the input voltage to the amplifier 202. The output voltage G(VIN-Vref) is coupled to the AZ capacitor 204, which recall in the preceding sample phase stored an AZ voltage, Vaz. Accordingly, in the conversion phase, Vaz is subtracted from G(VIN-Vref), thereby essentially zeroing the effect that the offset and noise of the amplifier 202 otherwise would have on the operation of the SAR ADC 100. Further, the differential voltage (G(VIN-Vref)–Vaz) from the AZ capacitor 204 is connected to the input of the latch 208. The latch 208 outputs either a logic low or high based on whether (G(VIN-Vref)–Vaz) exceeds a threshold limit of the latch 208, and that logic value is written to the bit position in the N-bit register 104 that was originally high for the current conversion phase iteration.

The preceding description of the first conversion phase iteration of the SAR ADC 100 repeats so that in total N conversion phase iterations occur, each iteration corresponding to a respective bit in the N bits of the N-bit register 104. Accordingly, following the first iteration, N–1 successive iterations occur, where each iteration is for a next less significant bit in the N-bit register 104 and until all N bits in the register 104 have been processed through respective conversion phase iterations. At the completion of those operations, the N bits in the N-bit register 104 present a digital approximation of VIN, and are provided to the output 118 as the CODE.

Figure 5:
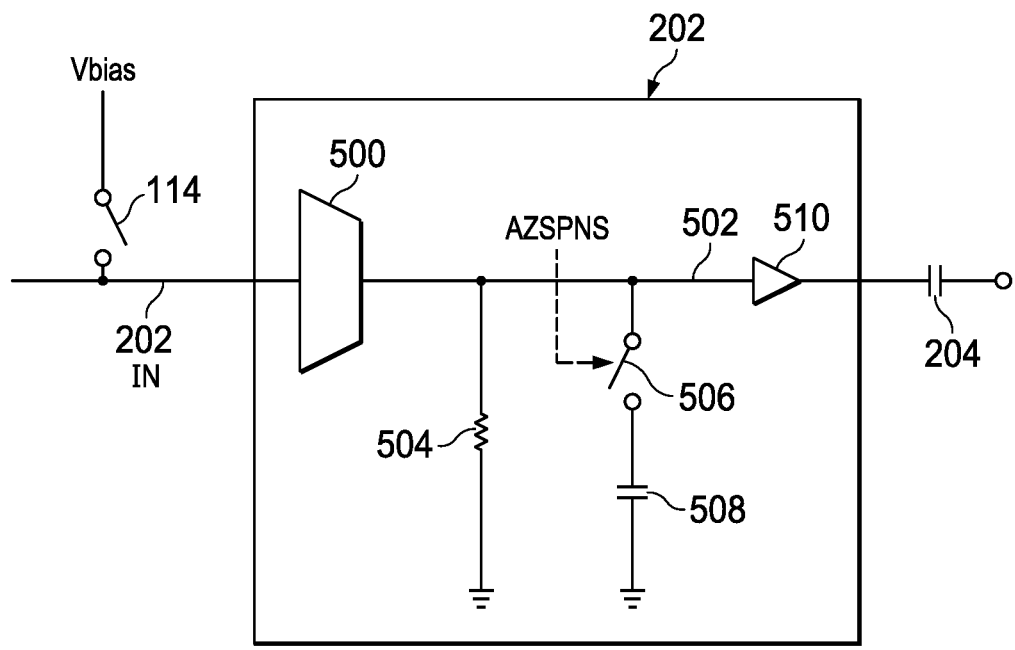
FIG. 5 illustrates a schematic of the SAR ADC amplifier 202 with greater detail elaborating on selective adjustment of the amplifier electrical attributes to be different during the sample phase versus the conversion phase.

FIG. 5 illustrates a schematic of the amplifier 202 (FIGS. 2-4) in greater detail, further elaborating on an example embodiment for the structure for, and method of operation of, the selective adjustment of the amplifier 202 electrical attributes to be different during the sample phase versus the conversion phase. For reference to prior Figures, FIG. 5 also includes, outside of the amplifier 202, the first bias switch 114 and the AZ capacitor 204. The throw of the first bias switch 114 is connected to the input of 202IN of the amplifier 202. The input 202IN is connected to an input of a transconductor 500, which in conjunction with a resistor 504, provides the earlier-introduced gain G. The output of the transconductor 500 is connected to a node 502. The node 502 is connected through the resistor 504 to ground. The node 502 is also connected to a pole of a noise-suppression switch 506. The noise-suppression switch 506 closes during sample phase auto zeroing when AZSPNS is asserted (and opens when de-asserted). The throw of the noise-suppression switch 506 is connected through a capacitor 508 to ground. The node 502 is also connected to the input of a zero-unity buffer 510, and the output of the zero-unity buffer 510 provides the output of the amplifier 202.

The operation of the FIG. 5 amplifier 202 in general is described earlier, with additional discussion now regarding the selective adjustment of its electrical attributes during the sample phase versus the conversion phase.

During the sample phase, recall that AZ is concurrently implemented and AZSPNS is asserted. Accordingly in FIG. 5, during the sample phase, the capacitor 508 is connected through the noise-suppression switch 506 to the node 502, that is, in the amplifier output and in parallel with the resistor 504 to ground. With both the resistor 504 and the capacitor 508 connected to the output of the transconductance 500, the electrical attributes of the amplifier 202 are selectively adjusted, namely, the 3 dB cutoff corner of the amplifier 202 is reduced. Accordingly, the lower 3 dB cutoff corner reduces the amplifier bandwidth (excludes higher frequencies), as compared to an instance where the node 502 is not capacitively coupled to ground in this manner Relatedly, as known in the art, the transconductance of an amplifier (e.g., the transconductance 500) provides thermal noise. In the illustrated embodiment, however, the sample phase selectively-reduced bandwidth, provided here by including the capacitance of the capacitor 508 during the sample phase AZ operation, filters out a higher-frequency portion of the amplifier thermal noise. This in turn reduces the amount of thermal noise energy that otherwise would appear in Vaz (see FIGS. 3 and 4). Accordingly, with the FIG. 5 switched-in capacitance, Vaz is generated as and represents a thermal noise suppressed AZ voltage, that is buffered by the buffer 510 and then stored, as shown in FIG. 2, to the AZ capacitor 204.

As described above, a number N of conversion phase iterations follow the sample phase. In the conversion phase iterations, recall that AZSPNS is de-asserted, and as a result in FIG. 5 the noise-suppression switch 506 opens and the capacitor 508 is disconnected from the node 502, thereby increasing the bandwidth of the amplifier 202 and also allowing the conversion phase iterations to occur at a speed not reduced as it would be were the capacitor 508 part of the amplification output during that phase. Accordingly, the conversion phase proceeds as described earlier, with the improvement that the AZ functionality provided by the voltage Vaz, stored on the AZ capacitor 204, will offset the output of the amplifier 202 more favorably due to the noise suppression of reduced bandwidth during the immediately preceding sample phase. More particularly, traditional AZ is directed to either DC or relatively low frequency (e.g., 10 Hz or less, sometimes referred to as flicker) noise, which noise is relatively constant over relatively long periods of time, as compared to the sample rate of the SAR ADC which is typically on the order of hundreds of KHz to several MHz. Accordingly, such traditional AZ approaches may store such noise to an offset capacitor, which is then auto-zeroed in a subsequent phase. At the same time as the longer duration noise, however, higher frequency noise also can appear from thermal noise, and the long duration period of storing the traditional AZ offset can or will include the higher-frequency thermal noise, which indeed can be fairly inconsistent from phase to phase given the relatively high frequency nature of thermal noise, as compared to DC and flicker noise. In other words, the higher frequency thermal noise during sampling does not necessarily correlate to the same noise, and its offset, during conversion. The example embodiment, therefore, reduces the storage of high frequency noise during AZ by selectively adjusting the electrical attributes of the amplification stage 200 during AZ, thereby improving the signal-to-noise ratio (SNR) of the SAR ADC 100 when it switches to the conversion phase. Accordingly, device operation, such as data conversion accuracy, is improved.

From the above, example embodiments include an ADC, such as a SAR ADC, with improved performance from selectively adjusting the ADC electrical attributes during different ADC phase operations. The adjustment as performed desirably reduces the possible storage of higher frequency noise as part of the AZ offset voltage during the sample phase. Further, in an example embodiment, the selectively-adjusted electrical attribute includes changing the amplification stage bandwidth to differ in the ADC sample phase versus its conversion phase. Further, the selectively adjusted bandwidth may be accomplished by changing the amplification signal path capacitance to differ in the sample phase from that of the conversion phase, for example, by switching a capacitor in and out of the amplifier output signal path in the sample and conversion phase, respectively. Still further, in the example embodiment, the changed capacitance is implemented in a first amplifier of cascaded amplifiers if the amplification stage includes plural amplifiers, as the gain of the first amplifier is the most impactful if cascading through plural amplifiers. Further, while the above-described attributes are shown and described, also contemplated are changes in various parameters, including dimensions, with the preceding providing only some examples, with others ascertainable, from the teachings herein, by one skilled in the art. Accordingly, additional modifications are possible in the described embodiments, and other embodiments are possible, within the scope of the following claims.

What is claimed is:

1. A circuit comprising:
   an input configured to receive an input analog voltage;
   a first switch that includes:
      a first input coupled to the input of the circuit;
      a second input coupled to receive a reference voltage; and
      an output;
   a first capacitor coupled to the output of the first switch; and
   a comparator that includes:
      an amplifier that includes:
         a transconductor that includes an input coupled to the first capacitor and an output;
         a buffer coupled to the output of the transconductor;
         a second capacitor coupled to a ground node; and
         a second switch coupled between the second capacitor and the output of the transconductor;
      a third capacitor coupled to the amplifier; and
      a latch coupled to the third capacitor.

2. The circuit of claim 1, wherein the comparator includes a third switch that includes:
   an input coupled to receive a bias voltage; and
   an output coupled to the latch.

3. The circuit of claim 2, wherein the second switch and the third switch are coupled to be controlled by an auto zeroing signal.

4. The circuit of claim 1 further comprising a digital-to-analog converter coupled to the second input of the first switch to provide the reference voltage.

5. A successive approximation analog-to-digital converter, comprising:
an input for receiving an input analog voltage;
sample phase circuitry comprising an amplifier and for providing the amplifier with a first set of electrical attributes and for sampling the input analog voltage in a sample phase; and
conversion phase circuitry comprising the amplifier and for providing the amplifier with a second set of electrical attributes differing from the first set of electrical attributes and for converting a comparison, of the sampling of the input analog voltage relative to a reference voltage, to a digital value in a conversion phase,
wherein the sample phase circuitry comprises circuitry for switching a capacitance between an output of the amplifier and a fixed potential in the sample phase; and
wherein the circuitry for switching is further for disconnecting the capacitance from between the output of the amplifier and the fixed potential in the conversion phase.

6. The successive approximation analog-to-digital converter of claim 5 wherein the conversion phase circuitry is for iteratively converting a comparison, of the sampling of the input analog voltage relative to an iteration respective reference voltage, to a digital value in the conversion phase.

7. The successive approximation analog-to-digital converter of claim 5:
wherein the sample phase circuitry is for providing an output of the amplifier with the first set of electrical attributes; and
wherein the sample phase circuitry is for providing the output of the amplifier with the second set of electrical attributes.

8. The successive approximation analog-to-digital converter of claim 7 wherein the first set of electrical attributes and the second set of electrical attributes comprise frequency bandwidth.

9. The successive approximation analog-to-digital converter of claim 7:
wherein the first set of electrical attributes comprises a first frequency bandwidth; and
wherein the second set of electrical attributes comprises a second frequency bandwidth larger than the first frequency bandwidth.

10. The successive approximation analog-to-digital converter of claim 5:
wherein the first set of electrical attributes comprises a first frequency bandwidth with a first upper corner frequency; and
wherein the second set of electrical attributes comprises a second frequency bandwidth with a second upper corner frequency larger than the first upper corner frequency.

11. The successive approximation analog-to-digital converter of claim 5 wherein the first set of electrical attributes and the second set of electrical attributes comprise frequency bandwidth.

12. The successive approximation analog-to-digital converter of claim 5:
wherein the first set of electrical attributes comprises a first frequency bandwidth; and
wherein the second set of electrical attributes comprises a second frequency bandwidth larger than the first frequency bandwidth.

13. The successive approximation analog-to-digital converter of claim 5 wherein the amplifier comprises a first amplifier in a cascade of a plurality of amplifiers.

14. The successive approximation analog-to-digital converter of claim 5 and further comprising a digital-to-analog converter for outputting the reference voltage.

15. The successive approximation analog-to-digital converter of claim 14 and further comprising an N-bit register for providing a digital value to the digital-to-analog converter for outputting the reference voltage; and;
wherein the conversion phase circuitry is for converting a comparison of the sampling of the input analog voltage for a number of iterations, each iteration converting, relative to an iteration respective reference voltage, to a digital value in the conversion phase; and
wherein the number of iterations equals N.

16. The successive approximation analog-to-digital converter of claim 5 wherein the first set of electrical attributes provides reduced thermal noise in the amplifier relative to thermal noise in the amplifier in the second set of electrical attributes.

17. A method of successive approximation of a digital code from an input analog voltage, comprising:
sampling the input analog voltage with an amplifier having a first set of electrical attributes in a sample phase, wherein the sampling in the sample phase include switchably coupling a capacitor to an output of the amplifier such that the capacitor is coupled between the output of the amplifier and a ground node; and
converting a comparison, of the sampling of the input analog voltage relative to a reference voltage, to a digital value in a conversion phase while providing the amplifier a second set of electrical attributes differing from the first set of electrical attributes, wherein the converting in the conversion phase includes decoupling the capacitor from the output of the amplifier.

18. The method of claim 17:
wherein the first set of electrical attributes comprises a first frequency bandwidth; and
wherein the second set of electrical attributes comprises a second frequency bandwidth larger than the first frequency bandwidth.

19. The method of claim 17:
wherein the first set of electrical attributes comprises a first frequency bandwidth with a first upper corner frequency; and
wherein the second set of electrical attributes comprises a second frequency bandwidth with a second upper corner frequency larger than the first upper corner frequency.

20. The circuit of claim 1 further comprising a resistor coupled between the output of the transconductor and the ground node in parallel with the second switch and the second capacitor.

* * * * *